United States Patent [19]
Spillane et al.

[11] Patent Number: 5,420,512
[45] Date of Patent: May 30, 1995

[54] ELECTRONIC CABLE TESTING SYSTEM

[75] Inventors: Philip E. Spillane, Oxnard; William D. Burch, Mission Viejo; Steven B. Sala, Capastrano Beach, all of Calif.

[73] Assignee: Paladin Corporation, Newburg Park, Calif.

[21] Appl. No.: 795,542

[22] Filed: Nov. 21, 1991

[51] Int. Cl.[6] ...................... G01R 31/02; G01R 19/00
[52] U.S. Cl. ........................................ 324/539; 324/66
[58] Field of Search ................. 324/539, 540, 541, 66, 324/520; 379/26

[56]         References Cited
U.S. PATENT DOCUMENTS

| | | |
|---|---|---|
| 2,584,680 | 2/1952 | Doncyson . |
| 2,810,881 | 10/1957 | Daily . |
| 3,514,552 | 5/1970 | Smith . |
| 3,818,329 | 6/1974 | Reaves, Jr. .......................... 324/540 |
| 4,035,479 | 7/1977 | Haines ................................. 324/540 |
| 4,418,312 | 11/1983 | Figler et al. . |
| 4,536,703 | 8/1985 | Jablway et al. ........................ 324/66 |
| 4,703,497 | 10/1987 | Ingalsbe . |
| 4,741,016 | 4/1988 | Callahan . |
| 4,912,755 | 3/1990 | Blood et al. . |
| 4,920,555 | 4/1990 | Ingalsbe . |
| 4,968,260 | 11/1990 | Ingalsbe . |
| 5,027,074 | 6/1991 | Haferstat ............................. 324/539 |
| 5,029,274 | 7/1991 | Goff et al. ............................ 324/540 |

FOREIGN PATENT DOCUMENTS

| | | | |
|---|---|---|---|
| 3924763 | 7/1991 | Germany | ............................ 324/539 |
| 503189 | 7/1973 | U.S.S.R. | ................................. 324/66 |

OTHER PUBLICATIONS

IBM Technical Disclosure Bulletin vol. 15 No. 1 Jun. 1972 Cable Continuity Checker Coleman et al.
IBM Technical Disclosure Bulletin vol. 16, No. 12 May '74 Cable Tester Formica.

*Primary Examiner*—Jack B. Harvey
*Assistant Examiner*—Maura K. Regan
*Attorney, Agent, or Firm*—Laubscher & Laubscher

[57]            ABSTRACT

A cable testing system includes a far end unit for alternately connecting the wire ends at the remote end of a cable with either a resistive load including a plurality of resistors connected with the wires, respectively, or a source of a-c signals of different frequencies supplied to the lines, respectively. A near end unit connected with the ends of the wires at the adjacent end of the cable is operable during the resistive mode of operation of the far end unit to measure open-circuit and short-circuit conditions of the wires. During the frequency signal mode of operation, crossover between wires is mapped by the use of a differential amplifier, a full-wave rectifier an a slope detector circuit, to provide pulse width, cycle length and slope data for identifying the various wires.

8 Claims, 7 Drawing Sheets

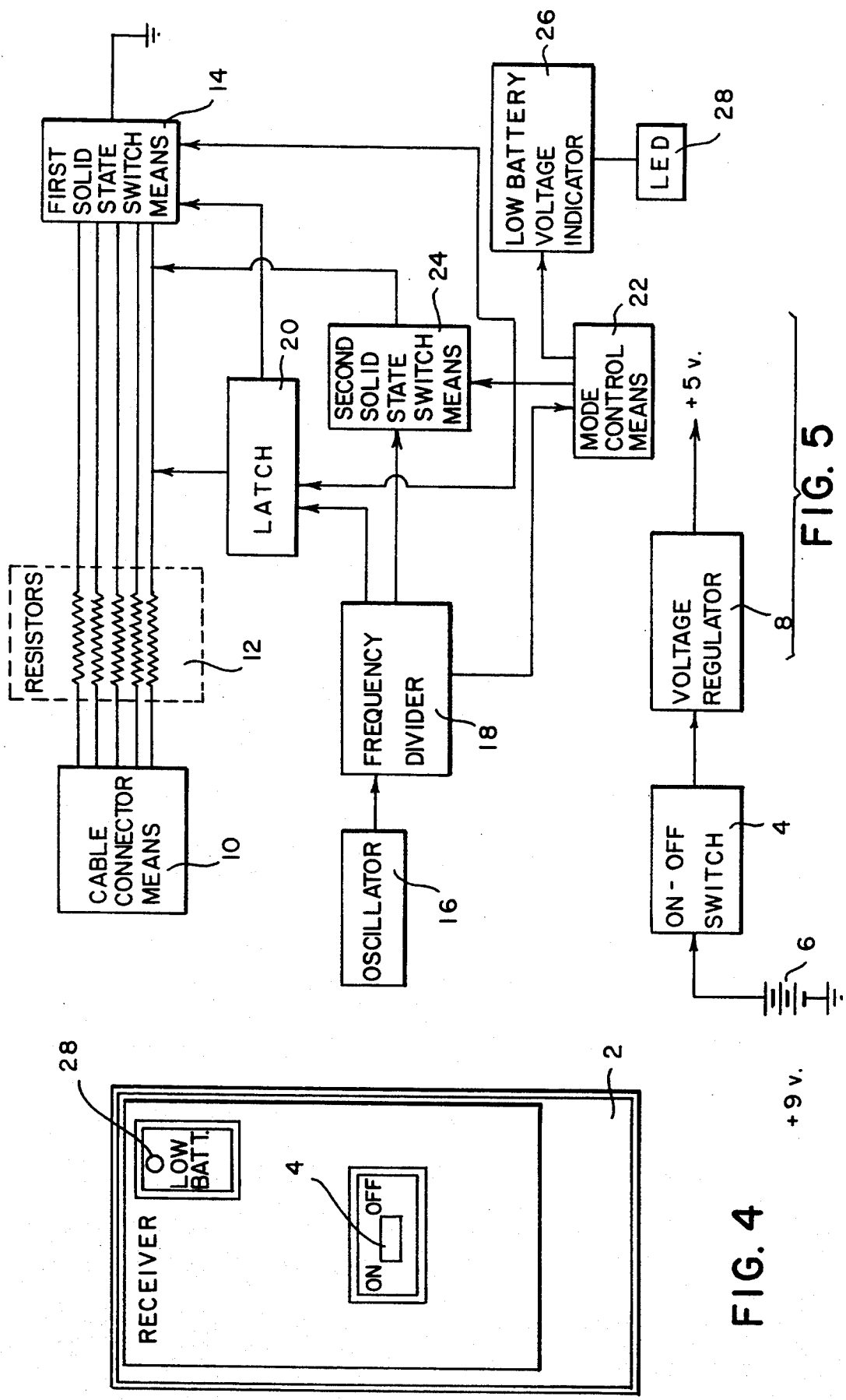

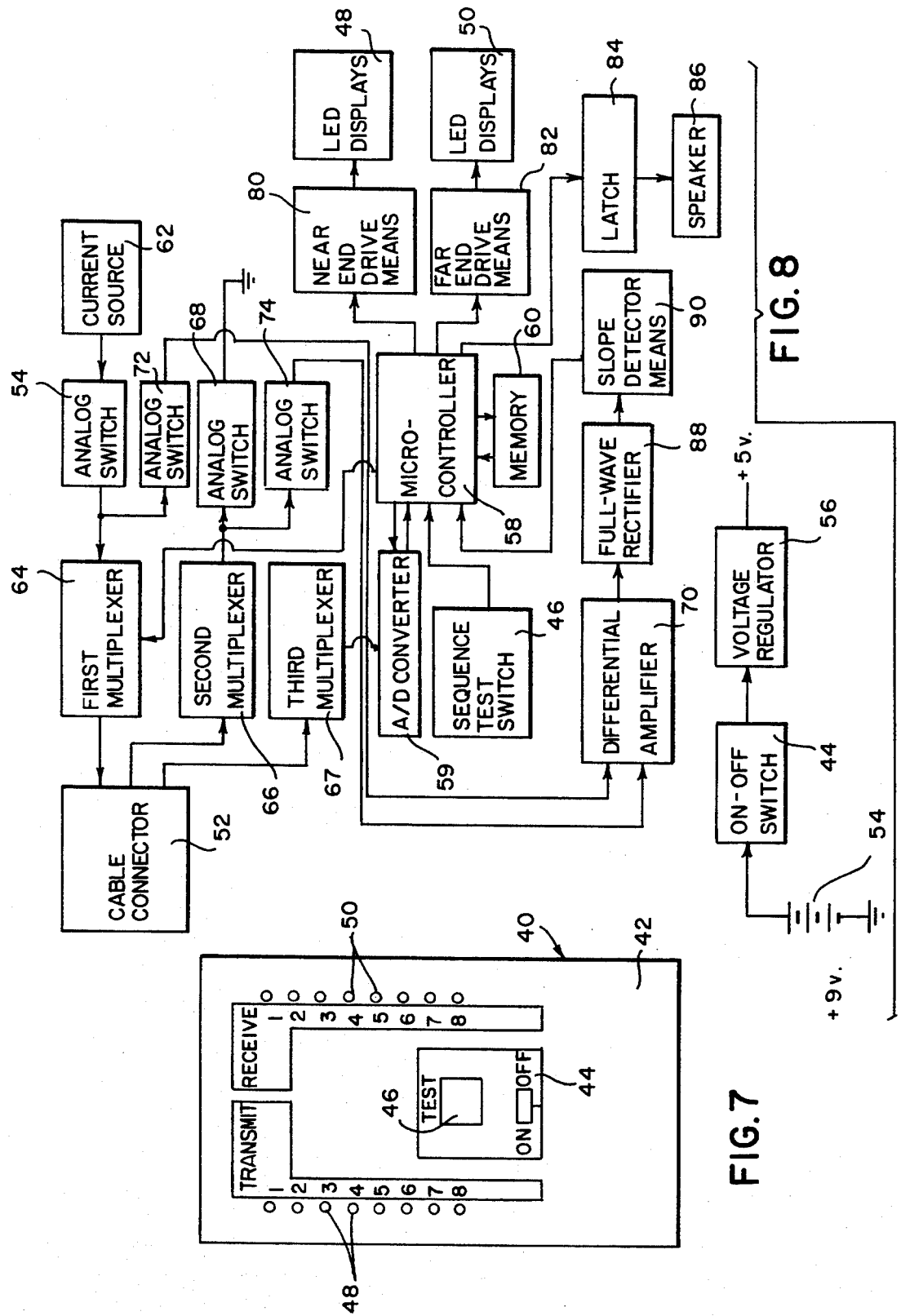

ELECTRONIC CABLE TESTING SYSTEM

BACKGROUND OF THE INVENTION

This invention relates to a cable testing system for determining open-circuit, short-circuit, and cross-over mapping between the wires of a cable, use being made of a far end unit connected with one end of the cable and operable between resistive and frequency signal modes, and a near end unit connected with the near end of the unit for determining open and short circuit conditions of the wires during the resistive mode, and for mapping cross-over between the wires during the frequency signal mode. In order to identify the wires, use is made of means for determining pulse width, cycle length and slope.

BRIEF DESCRIPTION OF THE PRIOR ART

Plant maintenance electricians are now called on to install and repair telecommunications wiring that supports data/voice communications. Computer networks now run high speed data transmission on unshielded twisted pair wiring.

The challenge for the electrical maintenance person is to establish that there is continuity of each of the eight conductors from the telephone closest to the office wall outlet. In addition, each of the eight conductors must be connected to the same pin inside the connector or junction block end to end. To make things even more difficult, there is usually some distance between the outlet and the telephone closet which prevents the use of an ohm meter buzz box.

Systems for testing multi-conductor cables are well known in the art, as evidenced for example, by the prior patents to Daily U.S. Pat. No. 2,810,881, Figler U.S. Pat. No. 4,418,312 and Ingalsbe U.S. Pat. Nos. 4,703,497, 4,912,755, 4,920,535 and 4,968,260, among others. Presently available cable testers are generally either high end large, expensive instruments, which check both continuity and other cable parameters, or low-end limited usage continuity testers. Although high end instruments generally include cable mapping capabilities, some units yield erroneous results owing to their measurement technique (resistance measurement). The low end instruments rely on wire pair measurements using light emitting diodes (LED'S) in series with each wire pair. However, this usually requires two operators (one at each end) and can still yield erroneous or incomplete results.

Some of the prior instruments rely on voltage and current measurements (yielding resistance) to determine the mapping of the cable wires. However, it has been determined that numerous wire combinations could be erroneously interpreted by this method. It was proposed that, in order to avoid these errors, it would be necessary to use a measurable electrical parameter—such as signal frequency—that uniquely identifies each wire in the cable system. The selection of the frequencies and the cable terminating method permitted wire mapping free of error even in cases of shorted wires. However, the use of signal frequencies transmitted from the far end unit does not easily provide the means for determining shorts and opens in the cable.

The present invention was developed to avoid the above and other drawbacks of the known cable testing systems.

SUMMARY OF THE INVENTION

Accordingly, a primary object of the present invention is to provide a cable testing system providing a combination of voltage and current measurements yielding cable shorts and opens, followed by signal frequency measurements resulting in correct cable mapping independent of wire crossover combinations.

Another object of the invention is to provide a hand-held battery-powered tester and receiver set which tests each conductor end-to-end for continuity and pin assignment. The receiver is attached to a de-energized cable of eight conductors or less and turned on. The transmitter is attached to the other end of the same cable at the telephone closet or another wall outlet. The transmitter is turned on and the test button is pushed. This causes an audible tone and a self diagnostic of the onboard micro processor (i.e., a microcontroller) and all sixteen high intensity LEDs. In less than three seconds, LED number one on the transmit side will light along with an LED on the receive side which signals continuity between those two pins end to end. Each time the test button is pushed, the next LED in sequence turns on at the transmit side, an audible tone is heard and if there is a connection, an LED on the receive side will light. If there is no connection (open circuit), a different tone is heard and no LED on the receive side will light. If these is a short circuit between conductors, either inside the connector or cable, a different audible tone will be heard. All conductors that are shorted together will then light LEDs on the transmit side.

A more specific object of the invention is to provide a system for checking the continuity status of a multi-wire cable by a single operator, whether or not the cable is actually installed. The measuring system consists of a cable near end interrogating unit and a cable far end terminating unit. The measuring system determines the opens, shorts and wire crossovers between the two ends of the cable in a manner of seconds. The system is completely independent of a preassigned ground or power wire.

According to a further object of the invention, the far end terminating unit connects the associated cable wire ends alternately between a resistive condition in which resistors are connected with the wires, and a frequency signal condition in which signals of different frequencies are applied to the cable ends, respectively. At the near end, the wires are successively connected in pairs—during the resistive condition at the far end—to determine by analog techniques open-circuit or closed-circuit conditions for each pair. During the frequency signal condition at the far end, the wires are tested for crossover conditions by digital techniques, use being made of a differential amplifier, a full-wave rectifier and a slope detector to determine pulse width, cycle length and slope, whereby the identity of each wire may be determined.

BRIEF DESCRIPTION OF THE DRAWINGS

Other objects and advantages of the invention will become apparent from a study of the following specification when viewed in the light of the accompanying drawings, in which:

FIG. 4 is a front view of the far end terminating unit that is connected with the remote end of the cable being tested;

FIGS. 5 and 6 are block diagrams and electrical schematic diagrams, respectively, of the receiver unit of FIG. 4;

FIG. 7 is a front view of the near end interrogating unit that is connected with the near end of the cable being tested; and FIGS. 8, 9 and 9A are block diagram and electrical schematic diagrams, respectively, of the near end interrogating unit of FIG. 7.

DETAILED DESCRIPTION

Figure 1:
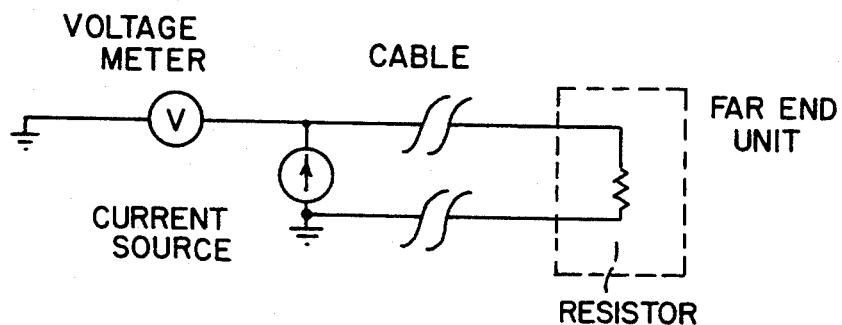
FIG. 1 is an electrical circuit diagram used in explaining the operation of the cable testing system of the present invention.

Referring first more particularly to FIG. 1, the operation of the cable testing system of the present invention occurs in two phases—namely, open-circuit/short-circuit testing, and wire mapping. Open-circuit/short-circuit detection is performed according to the basic electronic theory by which a conductive pathway will effect a change in current, and a corresponding change in voltage according to Ohm's Law, $E = I/R$. FIG. 1 illustrates how this concept is applied to detection of open and short circuits.

Current is applied to each wire in the cable, and the corresponding voltage drop is measured. An open cable wire will present an infinite resistance, and therefore result in no voltage drop as indicated by the voltage meter. A shortened condition in the cable will result in a very low resistance, and therefore a very large drop on the meter. Therefore, both open and shorted conditions may be detected in this manner.

Figure 2:
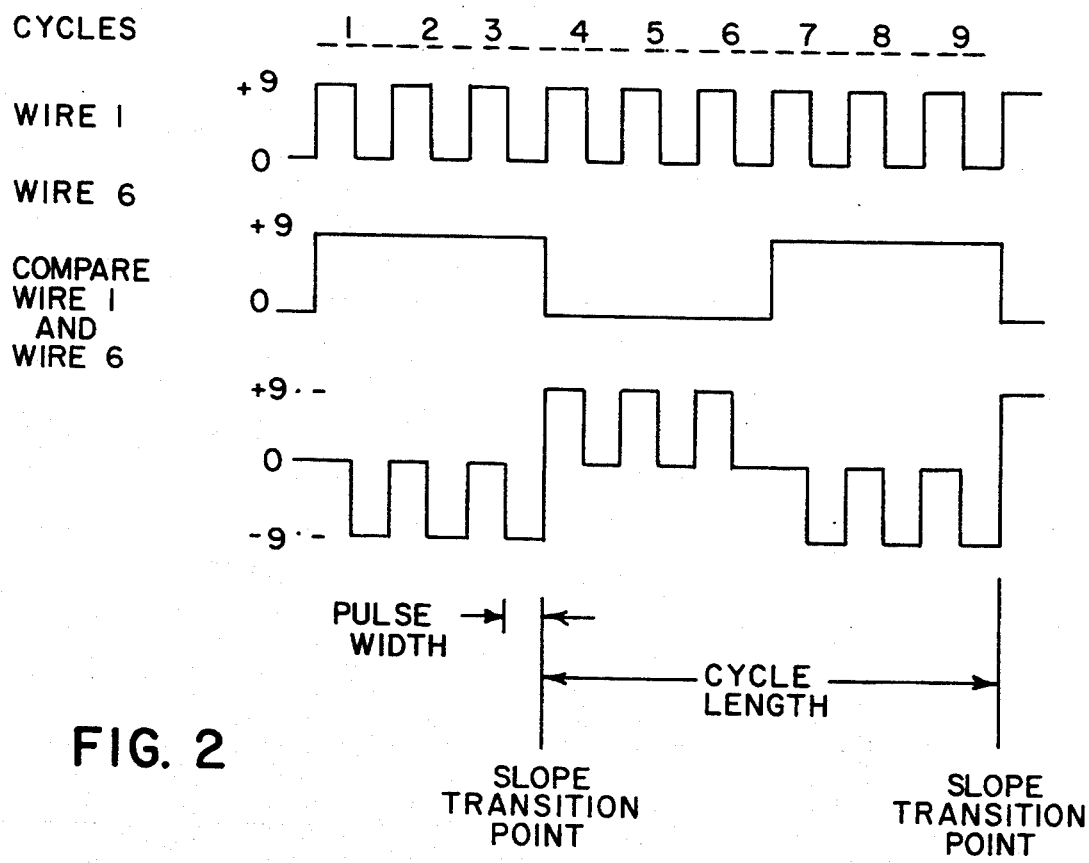
FIGS. 2 and 3 are waveform diagrams used in explaining the operation of the cable testing system of the present invention.

Cable crossovers, however, are much harder to detect, since unique identification of each wire in the cable is necessary without any preassigned power, ground, or known good wire. A digital approach is required for this test. To this end, a signal of a different frequency is applied to each wire. This approach is unique in that each frequency is measured differentially with respect to another frequency. A differential measurement without ground reference presents a type of exclusive-OR function. When both wires are high or low, the output is zero; when one is high and another low, the output is either +9 v or −9 v depending on which wire was high. When the signal on "wire one" is compared to "wire six", a unique repetitive waveform is detected; this waveform is different than that detected when "wire six" is compared to "wire one". A combination of any two wires will result in a unique waveform, enabling any two wires to be identified (See FIG. 2).

The differential comparison of two wires gives three variables used to identify wire combinations: pulse width, cycle width and slope. Slope detection is one of the factors making this measurement technique unique from existing approaches. By comparing the transition points (FIG. 2) when the differential measurement changes from either +9 v to −9 v or from −9 v to +9 v, "wire one" and "wire six" can be identified from "wire six" and "wire one".

The far end terminator unit of this system (FIG. 4) has been designed to reside at the remote end of the cable. According to the present invention, this unit will alternately apply a resistive load to the cable and then a voltage waveform of different frequency to each wire. Thus by combining an analog approach to identify open and short circuit conditions with a digital different timing/slope technique, any combination of wires may be deciphered. The far end unit includes a housing 2 containing an on-off switch 4 for controlling the supply of d-c power from battery 6 (FIG. 5) to the components of the unit via voltage regulator 8. The far end terminator unit is connected at the remote end of the cable with the individual wires thereof by connector means 10, whereby the wires are connected individually with the corresponding resistors, respectively, of a resistor bank 12 by first solid state switch means 14. As will be described in greater detail below, signals from an oscillator 16 are supplied to a frequency divider 18 to produce signals of different frequency that are supplied to the various wires of the cable, respectively, by the latch 20. The first solid state switch means 14 are closed during resistance measurement, and are opened during frequency measurement. Mode control means 22 controls the operation of the far end terminator between the resistive and frequency signal testing conditions. Second solid state switch means 24 are connected between the frequency divider 18 and the resistor lines, and low battery voltage indicator means 26 connected with the mode control means includes a low voltage indicator lamp 28 carried by the housing 2 of the far end terminator unit, as shown in FIG. 4. The specific components of the units of FIG. 5 have been illustrated in greater detail in the circuit diagram of FIG. 6, and will be discussed with greater particularity below.

Figure 9:
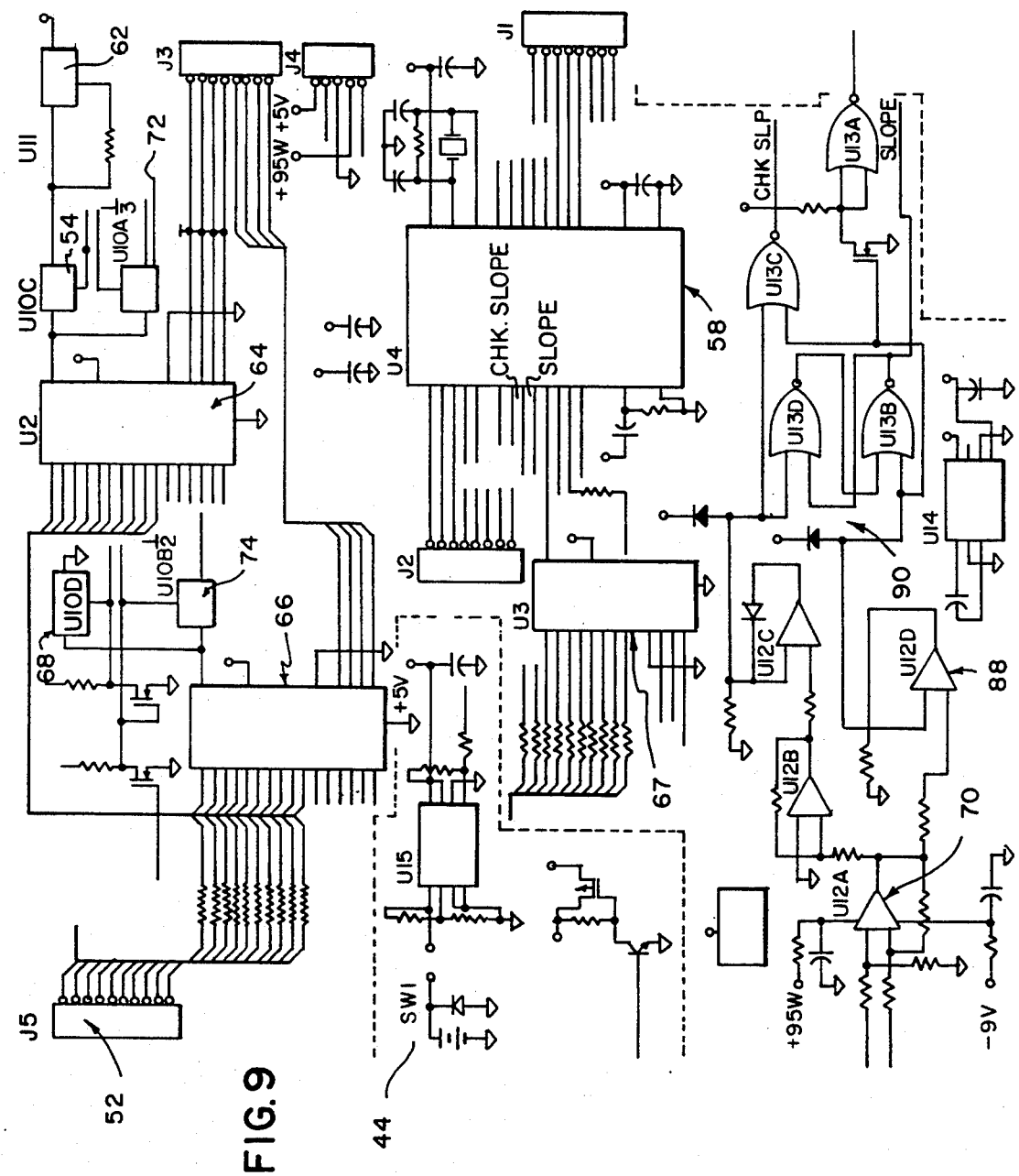
Figure 9A:
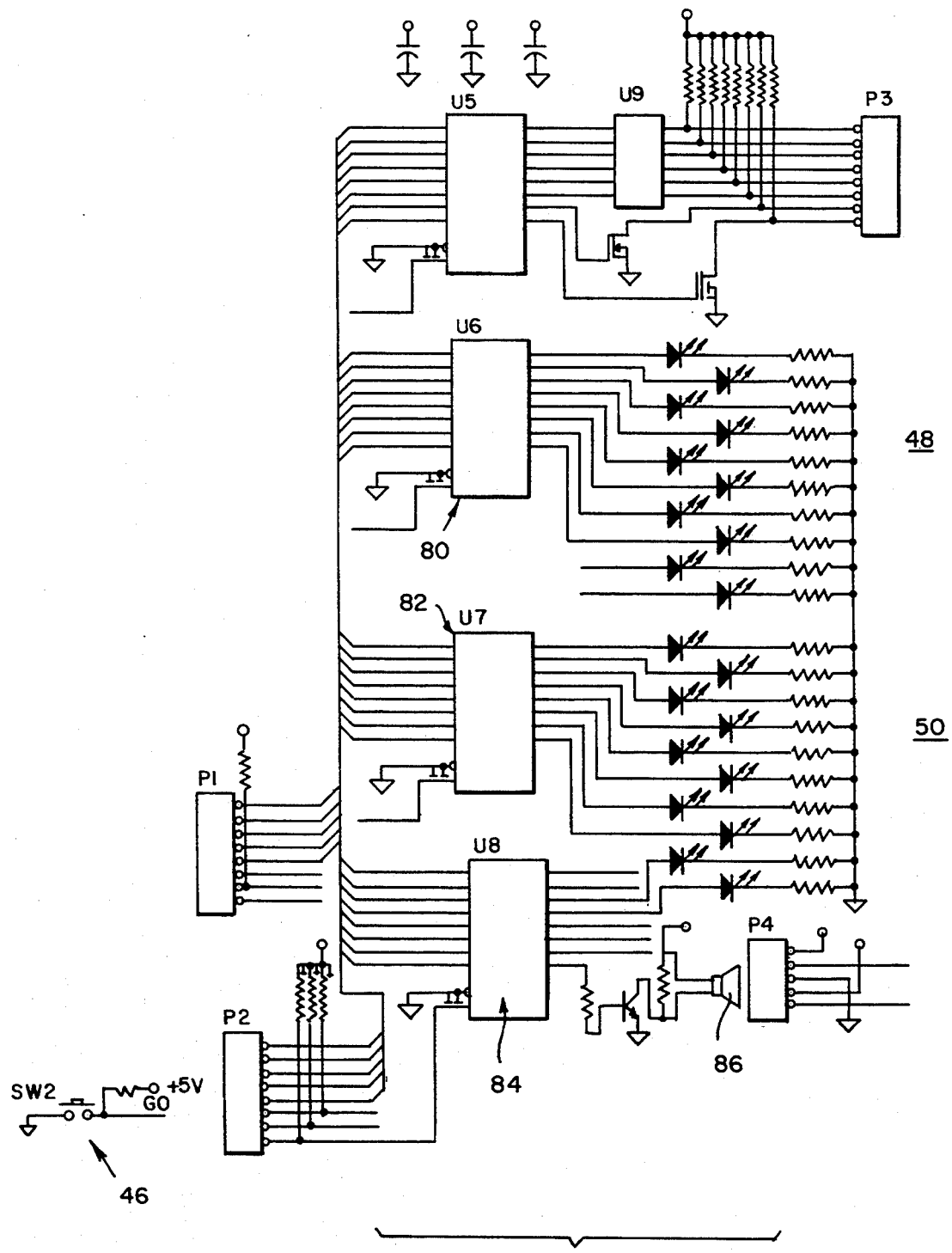

Referring now to FIGS. 7-9, at the near end of the cable, a near end interrogator unit 40 is provided having a housing 42 including an on-off switch 44, a test switch button 46, and a plurality of transmit and receive light emitting diodes 48 and 50, respectively, corresponding with the wires of the cable. The unit includes a cable connector 52 that is connected at the near end of the cable with the wires thereof. The on-off switch 44 connects a battery 54 with the components of the unit via voltage regulator 56, and test switch 46 supplies an input signal to the system microcontroller (or microprocessor) 58 having a memory 60. Current source 62 is connected with the cable connector 52 via analog switch 54 and first multiplexer 64, and the return to ground from cable connector 52 is accomplished via second multiplexer 66 and analog switch 68. A third multiplexer 67 is connected between the cable connector 52 and the microcontroller 58. The first and second multiplexers are also connected with the input terminals of differential amplifier 70 via analog switches 72 and 74, respectively, and an input from cable connector 52 is supplied to the A/D converter within the microcontroller 58 via third multiplexer 66. The outputs of microcontroller 58 are connected with the near end and far end drive circuits 80 and 82 for operating the LED displays 48 and 50, respectively, and latch 84 connects microcontroller 58 with speaker 86. The output from differential amplifier 70 is rectified by the full-wave rectifier means 88 which supplies an input signal to slope detector means 90 the output of which is connected with microcontroller 58.

Operation (1) Open Circuit Testing

Assume that the far end terminating unit 2 is connected with the wires at the remote cable end and that switch 4 is turned to the "on" position, and that the near end interrogating unit 40 is connected with the wires on the adjacent cable end. Referring to FIG. 8, a test is initiated by pressing the "Test" button 46, whereupon power is applied to all circuitry and the microcontroller 58 is activated. The inverting input of differential amplifier 70 is connected with multiplexer 66, and the non-inverting input is connected with multiplexer 64.

To test for open wires, two good wires must be available. Multiplexer inputs are incremented through all possible combinations of wires until 10 valid waveforms from the far end unit are detected. Should no two good wires be detected after approximately five seconds, an audible tone generator and flashing LED are activated indicative of two things: (1) there are no two good wires in the cable, or (2) the far end unit is inoperative. Either of these two conditions prevents testing of the cable.

When two valid wires are detected, the microprocessor polls the wires to determine when the frequency phase of the far end unit is completed and open circuit testing may begin.

The output from multiplexer 64 is connected with current source 62. The input to multiplexer 66 is set to the first good wire located above (now the reference wire); the output from multiplexer 66 is shorted to ground. Multiplexer 67 directs inputs from the cable to the analog-to-digital converter inside microcontroller 58. Software directs multiplexer 64 to sequentially connect each wire to the current source; the corresponding voltage is measured with respect ground by the analog-to-digital converter within the processor. As explained above, an open circuit results in a high measured voltage.

When three valid open circuit measurements are taken for a given wire, that wire is labeled in memory as open circuit. No other tests are performed on that wire. This process is repeated until all wires have been tested.

(2) Short Circuit Testing

Short circuit testing is performed by grounding "wire one" and applying a current source to subsequent wires. Analog voltage measurements are taken for each wire not previously determined to be open circuit. Three voltage readings below a "short circuit threshold" result in those wires being labeled short circuit. Next "wire two" is grounded and current applied to subsequent wires. This process is continued until each combination of wires has been analyzed.

This ends the analog phase of testing. The processor will change the multiplexers to direct inputs to the differential amplifier 70, and poll the good wires to detect when the far end unit has begun to emit frequencies.

(3) Crossover Mapping

Figure 3:
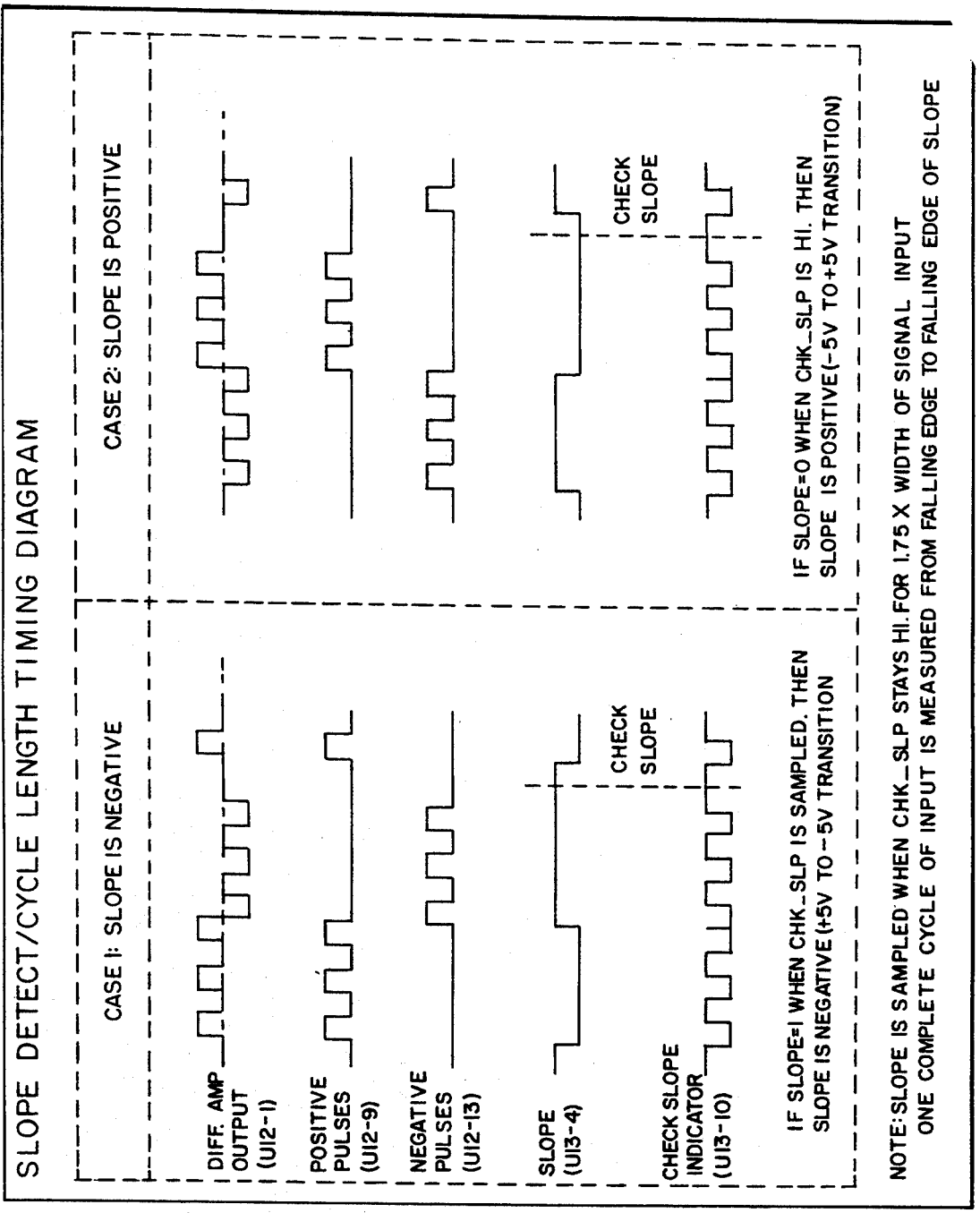

When three frequency inputs have been detected, the processor begins to make three measurements necessary to identify the wires. First the pulse width of the positive outputs from differential amplifier 70 and full-wave rectifier 88 is measured. Next the cycle length is measured by timing the interval between slope transition points (See FIG. 2). Lastly the slope is determined. More particularly, the negative-going pulses from the differential amplifier are inverted and separated from the positive pulses by inverting amplifier U12B (FIG. 9) and full-wave rectifier U12C. This signal is NOR'd by U13C with the positive pulses detected by U12D to provide an indicator as to when a slope measurement must be performed. When this output is high for an interval greater than one pulse width, a valid slope measurement may be performed. FIG. 3 illustrates two cases, one to show a negative slope condition, and another to show a positive slope condition.

Thus pulse width, cycle length and slope measurements are taken for each wire in the cable that is not open/short circuited. These measurements are compared to data in a lookup table to identify each wire. A Mapped Data Register in memory 60 is updated to reflect the configuration of the cable and end the diagnostic portion of the software. Power to all unnecessary circuitry is disabled to extend battery life.

Data on "wire one" is displayed upon completion of tasks detailed above and the microprocessor set into a power-efficient sleep mode. The LED on the left side (cable near end) is illuminated along with that on the right or left side corresponding to the status on the far end of the cable: a short will illuminate another LED on the left side to indicate the shorted location; an open condition will not illuminate any other LED; a crossed over wire will illuminate an LED on the right side corresponding to the location of the crossover; a good wire will illuminate LED's directly across from each other.

In addition to the visible indicators, an audible indicator is provided by modulating piezo element BZ1 at different frequencies and cycle lengths, providing a different tone or each abnormality.

Subsequent presses of the Test button 46 will activate the processor and display the next set of data. If the Test button is not pressed for approximately one minute, the display is extinguished to reduce current consumption; all data however, is retained, and another press of the Test button will restore the display.

Data is erased and a new test enabled by cycling power switch 44 off and on again.

Figure 6:
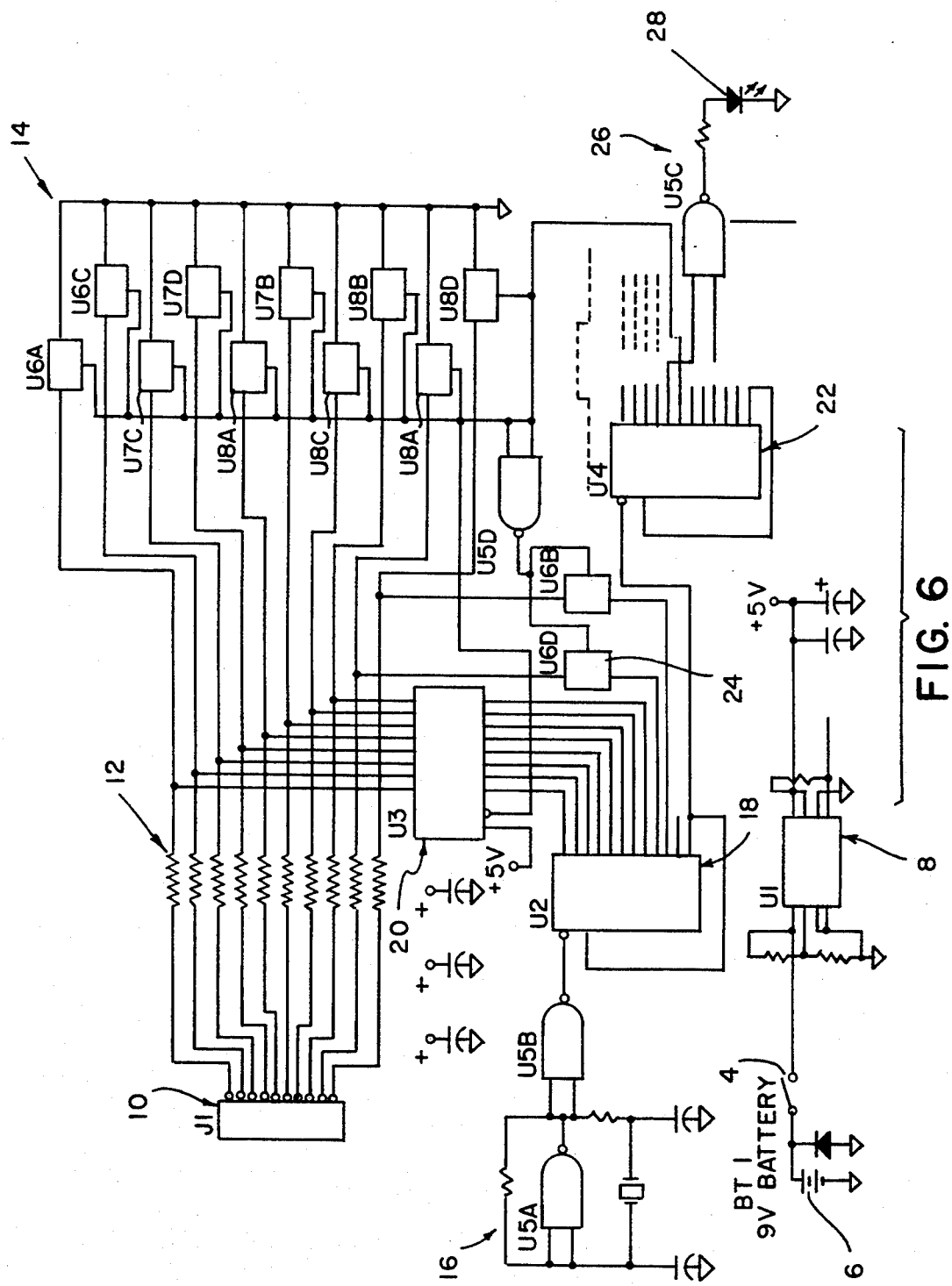

The operation of the system will now be described in greater detail with reference to the circuit diagrams of FIGS. 6 and 9.

The far end transmitter unit automatically cycles between two modes of operation, the resistance mode and the frequency mode. In the resistance mode all resistor ends opposite J1 are shorted together by solid state switches (U6, U7, and U8). Latch 20 (U3) outputs are in high impedance state. Shorting of the resistor ends enables the near end unit to measure the resistance of each wire and determine if a cable wire is shorted to another wire or is open circuited. No mapping is performed at this time. The terminating unit remains in the resistance measurement mode for a fixed time period. At the end of the resistance mode, the near end unit has measured the resistance of each cable wire and resistors (performed in pairs). Based upon these measurements, the near end unit has determined if each wire is either open circuited, short circuited, or completed continuity. Wire locations which has opens and shorts are retained in memory 60 at the near end unit for displaying and for use in the mapping procedure.

During the frequency signal mode, the solid state switches 14 are opened and the outputs of multiplexer 20 and second solid state switches 24 are applied to each wire in the cable through the resistors 12. The test signals applied to each resistor are unique in frequency, being a fixed multiple of each other. Use of this frequency output is discussed in the near end operation below. This frequency output mode lasts for a fixed period of time before switching back to the resistance mode of operation. This cycling between the two modes continues as long as power is applied to the terminating unit.

As discussed above, the two modes of operation (resistance measurement and frequency measurement) of the terminating unit establish the parameters which enable the near end interrogating unit to measure line resistance (opens and shorts) and determine cable mapping.

Referring now to FIG. 9, when the microcontroller 58 detects that the far end terminating unit is in the resistance mode (no output pulses), the current source output 62 is applied through the multiplexer 64 and analog switches 54 with the current flowing through a selected pair of wires at the output connector 52 and the terminating resistors in the far end unit. The current is returned to ground through the multiplexer 66 and analog switch 68. The voltage across the selected wire pair and resistors is measured by an analog-to-digital converter internal to the microcontroller 58. The multiplexer 67 controlled by the microcontroller selects the wires being measured and applies the voltage to the A/D converter. Based upon the voltage drop, the microcontroller determines if the wire pair has good continuity, are shorted together, or if one or both wires are open circuit. Depending on the resolution and accuracy of the A/D, the near unit can also determine a high resistance (such as a bad crimp contact) path.

The software routine controlling the microcontroller selects pairs of wires in a manner to ensure that all wires are checked and that the status of each wire is determined even if only two wires have continuity. The status of each wire (open, short, good continuity) is sorted in the memory of the microcontroller for use in the mapping routine and for displaying cable line status at the end of the test routines.

It is important to note that the resistance measurement method is not used to map the cable. Because of possible cross overs, any attempt to map the cable using only this method can yield erroneous results.

When the far unit (FIGS. 4–6) enters the frequency mode, a square wave $f_0$ frequency of is applied to wire "one" at the output connector (10). This frequency is divided down such that each succeeding wire is ½ the frequency of the previous wire. For example, wire 2 is $f_0/2$, wire 3 is $f_0/4$, wire 4 is $f_0/8$, etc. The multiplexers 64, 66 and switches 72, 74 in the near unit direct these signals generated by the far unit to the differential amplifier 70.

The differential amplifier 70 amplifies the difference between the two signals on the wire pair selected by the mircocontroller 58. Since the two signals have different frequencies, the output of the differential amplifier is unique to each pair of wires in output pulse width and the number of pulses grouped together. Additionally the slope that occurs during the transition from the groups of pulses are either positive or negative depending on which wire is applied to the positive input of the differential amplifier. The wire with the higher frequency signal will result in a positive slope if that signal is applied to the positive input. Otherwise, the slope will be negative. These characteristics are illustrated in FIG. 3. Therefore by the slope indicating which of the two wires has the higher frequency signal, the microcontroller knows which wire is above which in the test connector sequence (of the two being tested). The slope detector circuit 90 provides signals to the microcontroller (CHK SLP and SLOPE) to indicate slope polarity. Therefore, having determined for the two wires being tested the wire closest to pin 1 from the transition slope information, and having measured the pulse width and the number of pulses, the microcontroller can determine the mapping of the two wires under test by comparing the test results with a look-up table located in the microcontroller.

If it is determined during the resistance mode that two or more wires are shorted, or if a wire is open, those wires are excluded from the mapping (frequency) test routine.

At the conclusion of the mapping routine, the cable under test connection status is presented the user by lighting the LED's on the front panel of the rear unit. This is accomplished by displaying sequentially starting with LED one lighting on the row of LED's representing the near end cable connectors. With LED number one lit immediately (at the end of the mapping routine), the status of cable connections to near end pin 1 is indicated by lighting LED's on the row of LED's representing the far end connector. If wire one is open, no LED is lit. Otherwise, any wire connected to near end pin 1 has a LED lit on the far end LED's. Any wire shorted to wire 1 is indicted by lighting the LED of the shorted wire at this time. When the test switch is pressed the LED on the near end row representing pin 2 of the near end connector turns on and the first LED on that row turns off. At the same time, the LED(s) representing wires connected to pin 2 are lit on the far end LED's. Each time the test switch is pressed the next LED on the near end unit is lit and the corresponding mapping indicator by far end LED's. This sequence continues until each line's status is indicated. The operator can continue to sequence through the cable status display as many times as desired.

Additionally, an audio device 86 indicates when the cable interrogation sequence is completed. The beeper also indicates audibly the cable status of each wire as the test switch is pressed. The tone of the beeper changes depending on wire condition, i.e., short, open, or continuity.

The cable tester also includes a power-off feature if the test switch is not pressed for a preset period of time.

If a new cable is to be tested, the operator must place the power on switch in the "RESET/OFF" position momentarily to start a new test sequence.

What is claimed is:

1. An electronic system for testing the wires of a cable having near and far ends, comprising:
   (a) far end terminal means (2) for connection with the wires at the far end of the cable, including:
      (1) resistive load means (12) including a plurality of resistors adapted for connection with the wire ends, respectively;
      (2) signal supply means (18) for supplying to the wires a plurality of alternating-current signals each having a different frequency, respectively; and
      (3) mode control means (22) operable between resistive load and frequency signal conditions for alternately connecting the far end wire ends with said resistive load means and with said signal supply means;
   (b) near end interrogator means (40) for connection with the wires at the near end of the cable, including:
      (1) a current source (62);
      (2) means including a first multiplexer (64) for successively connecting the near ends of the wires with said current source;
      (3) means including a second multiplexer (66) for successively connecting the near ends of the wires with ground;

(4) microcontroller means including an analog-to-digital converter (59) and a memory (60), said microcontroller means having input terminals and output terminals;

(5) third multiplexer means (67) for successively connecting the near end wire ends with corresponding input terminals of said microcontroller means;

(6) said microcontroller means being operable during said resistive load condition to conduct open-circuit and closed-circuit tests on said wires by operating said multiplexer means to connect successive wire pairs between said current source and ground, and by measuring the change in voltage level corresponding with each test;

(7) means operable by said microcontroller during the frequency signal condition for identifying crossover between the wires, including:
   (a) a differential amplifier (70) having a pair of inputs and an output;
   (b) means (72,74) for connecting said differential amplifier inputs with the input of said first multiplexer means and the output of said second multiplexer means, respectively;
   (c) first full-wave rectifier means (88) having an input terminal connected with said differential amplifier output terminal, and an output terminal; and
   (d) slope detector means (90) connected between said full-wave rectifier outlet and an inlet of said microcontroller, thereby to afford pulse width, cycle length and slope values for use in identifying the respective cables; and (8) display means (48,50) connected with the output terminals of said microcontroller means for indicating the operating status of each wire.

2. Apparatus as defined in claim 1, wherein said far end terminal means includes a first d-c voltage source (6), and a first on-off switch (4).

3. Apparatus as defined in claim 2, wherein said far end terminal means includes low voltage indicating means 28.

4. Apparatus as defined in claim 1, wherein said near end display means includes visual display means (48,50).

5. Apparatus as defined in claim 4, wherein said display means further includes audible means (86).

6. Apparatus as defined in claim 4, wherein said display means further includes near end drive means (80) for operating a first group of visual display means, and far end drive means (82) for operating a second group of said visual display means.

7. Apparatus as defined in claim 1, and further including sequence test switch means (46) connected with an input of said microcontroller.

8. Apparatus as defined in claim 1, wherein said slope detecting means further includes inverting amplifier means (U12B) for inverting the negative going pulses from said differential amplifier, said inverting amplifier means having an input connected with the output of said differential amplifier in parallel with said first full-wave rectifier, said inverting amplifier means having an output, second full-wave rectifier means (U12C) connected with said inverting amplifier output, and NOR circuit means (U13C) having a pair of inputs connected with the outputs of said first and second full-wave rectifiers, thereby to provide an indication as to when a slope measurement must be performed.

* * * * *